(12) United States Patent
Lee et al.

(10) Patent No.: US 12,507,446 B2
(45) Date of Patent: *Dec. 23, 2025

(54) SEMICONDUCTOR DEVICE

(71) Applicant: TAIWAN SEMICONDUCTOR MANUFACTURING CO., LTD., Hsinchu (TW)

(72) Inventors: Wei-Yang Lee, Taipei (TW); Ting-Yeh Chen, Hsinchu (TW); Chii-Horng Li, Hsinchu County (TW); Feng-Cheng Yang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/346,480

(22) Filed: Jul. 3, 2023

(65) Prior Publication Data
US 2023/0369490 A1 Nov. 16, 2023

Related U.S. Application Data

(60) Continuation of application No. 17/320,687, filed on May 14, 2021, now Pat. No. 11,735,660, which is a
(Continued)

(51) Int. Cl.
*H10D 30/69* (2025.01)
*H10D 30/01* (2025.01)
*H10D 30/62* (2025.01)
*H10D 62/822* (2025.01)
*H10D 84/85* (2025.01)
*H10D 62/13* (2025.01)
*H10D 84/01* (2025.01)
*H10D 84/03* (2025.01)

(52) U.S. Cl.
CPC ........ *H10D 30/797* (2025.01); *H10D 30/024* (2025.01); *H10D 30/0245* (2025.01); *H10D 30/6211* (2025.01); *H10D 30/6212* (2025.01); *H10D 62/822* (2025.01); *H10D 84/853* (2025.01); *H10D 62/151* (2025.01); *H10D 84/0167* (2025.01); *H10D 84/017* (2025.01); *H10D 84/038* (2025.01)

(58) Field of Classification Search
CPC ............ H01L 29/7848; H01L 27/0924; H10D 30/797; H10D 30/024; H10D 62/822; H10D 84/853
See application file for complete search history.

(56) References Cited

U.S. PATENT DOCUMENTS 7,425,740 B2 9/2008 Liu et al.
8,048,723 B2 11/2011 Chang et al.
(Continued)

*Primary Examiner* — Samuel A Gebremariam
(74) *Attorney, Agent, or Firm* — Birch, Stewart, Kolasch & Birch, LLP

(57) ABSTRACT

A method includes forming a fin in a substrate. The fin is etched to create a source/drain recess. A source/drain feature is formed in the source/drain recess, in which a lattice constant of the source/drain feature is greater than a lattice constant of the fin. An epitaxy coat is grown over the source/drain feature, in which a lattice constant of the epitaxy coat is smaller than a lattice constant of the fin.

20 Claims, 14 Drawing Sheets

Related U.S. Application Data division of application No. 15/431,144, filed on Feb. 13, 2017, now Pat. No. 11,011,634.

(60) Provisional application No. 62/427,945, filed on Nov. 30, 2016.

(56) References Cited

U.S. PATENT DOCUMENTS

| | | |
|---|---|---|
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 9,449,885 B1 | 9/2016 | Reznicek |
| 2011/0068407 A1 | 3/2011 | Yeh et al. |
| 2011/0147828 A1 | 6/2011 | Murthy et al. |
| 2013/0285153 A1 | 10/2013 | Lee et al. |
| 2014/0183600 A1 | 7/2014 | Huang et al. |
| 2014/0252489 A1 | 9/2014 | Yu et al. |
| 2014/0264590 A1 | 9/2014 | Yu et al. |
| 2014/0264592 A1 | 9/2014 | Oxland et al. |
| 2015/0108544 A1* | 4/2015 | Ching .............. H01L 29/66795 257/192 |
| 2015/0263003 A1 | 9/2015 | Lee et al. |
| 2016/0181285 A1 | 6/2016 | Harley et al. |

\* cited by examiner

SEMICONDUCTOR DEVICE

PRIORITY CLAIM AND CROSS-REFERENCE

This application is a continuation of U.S. application Ser. No. 17/320,687, filed on May 14, 2021, which is a divisional of U.S. application Ser. No. 15/431,144, filed on Feb. 13, 2017, issued as U.S. Pat. No. 11,011,634 on May 18, 2021, which claims priority to U.S. Provisional Application Ser. No. 62/427,945, filed Nov. 30, 2016, the entirety of which is incorporated by reference herein in their entireties.

BACKGROUND

The source/drain regions of a fin-field effect transistor (finFET) are commonly formed by epitaxy growing. Different materials are used for n-type metal-oxide-semiconductor (MOS) and p-type MOS. For example, the nMOS transistor source/drain regions are formed with silicon phosphate (SiP), and the pMOS transistor source/drain regions are formed with silicon germanium (SiGe).

Source/drain regions grown with silicon phosphate, however, suffer from drawbacks. Silicon phosphate grows in an isotropic manner. It means the silicon phosphate very often expands in lateral direction. If the silicon phosphate cannot be contained in its predetermined region, the lateral expansion can lead to serious problems. For example, when the silicon phosphate source/drain regions are formed first and followed by the formation of the silicon germanium source/drain regions. The recessing of the pMOS fin structure may cause damage to the laterally expanding nMOS source/drain regions (i.e., the silicon phosphate structure).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
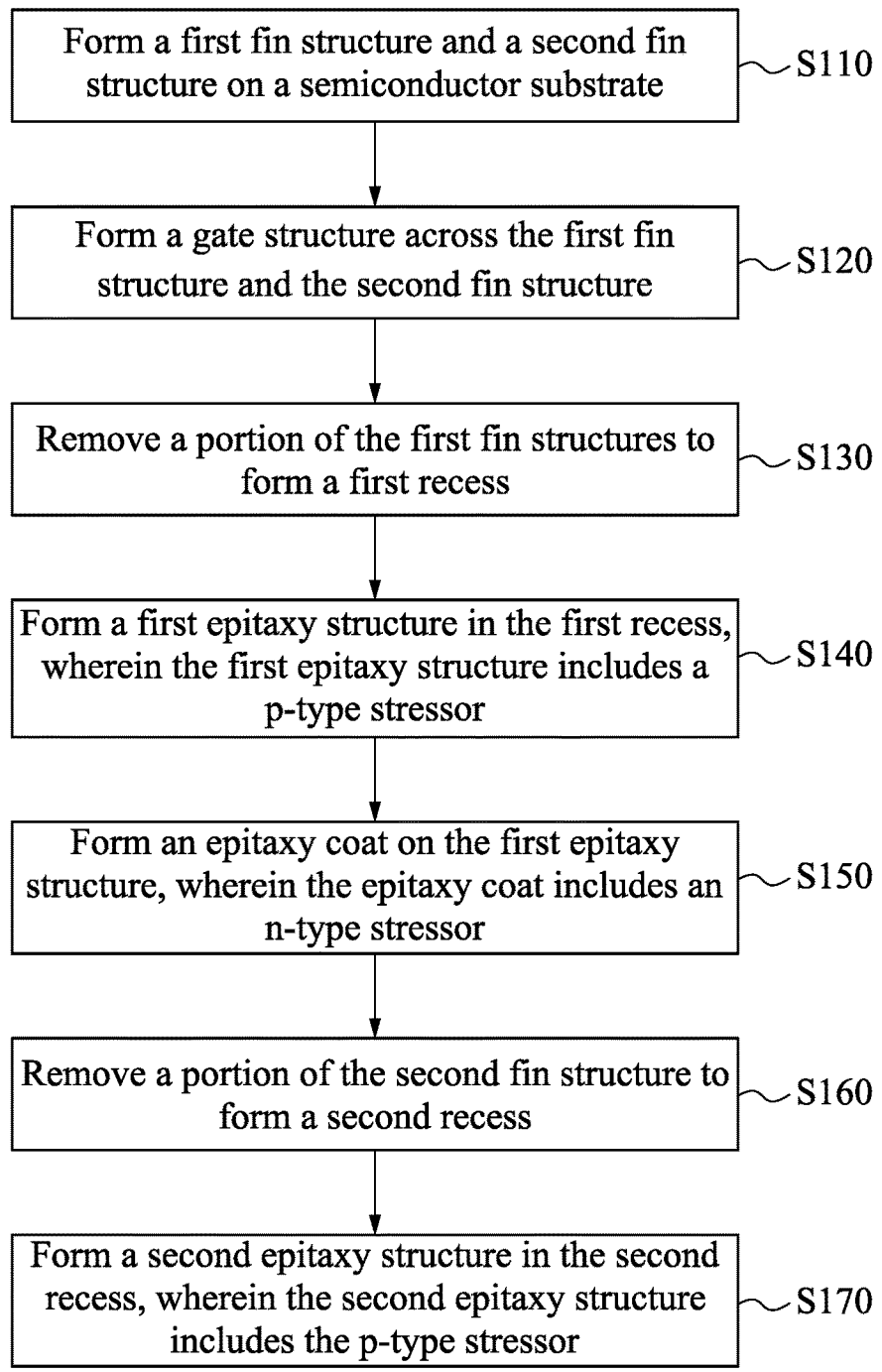
FIG. 1 is a flow chart illustrating a method of fabricating finFET device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a flow chart of a method 100 of fabricating a semiconductor device in accordance with some embodiments of the instant disclosure. The method begins with operation S110 in which a first fin structure and a second fin structure are formed on a semiconductor substrate. The method continues with operation S120 in which a gate stack is formed across the first fin structure and the second fin structure. Subsequently, operation S130 is performed. A portion of the first fin structure is removed to form a first recess. The method continues with operation S140 in which a first epitaxy structure is formed in the first recess. The first epitaxy structure includes a p-type stressor. The method continues with operation S150 in which an epitaxy coat is formed on the first epitaxy structure. The epitaxy coat includes an n-type stressor. The method continues with operation S160 in which a portion of the second fin structure is removed to form a second recess. The method continues with operation S170 in which a second epitaxy structure is formed in the second recess. The second epitaxy structure includes the p-type stressor.

A fin field-effect transistor (FinFET) embodiment and the method of forming the same are presented. The intermediate stages of manufacturing the embodiment are illustrated. The variations of the embodiment are discussed. Throughout the various views and illustrative embodiments, like reference numbers are used to designate like elements.

Figure 2:
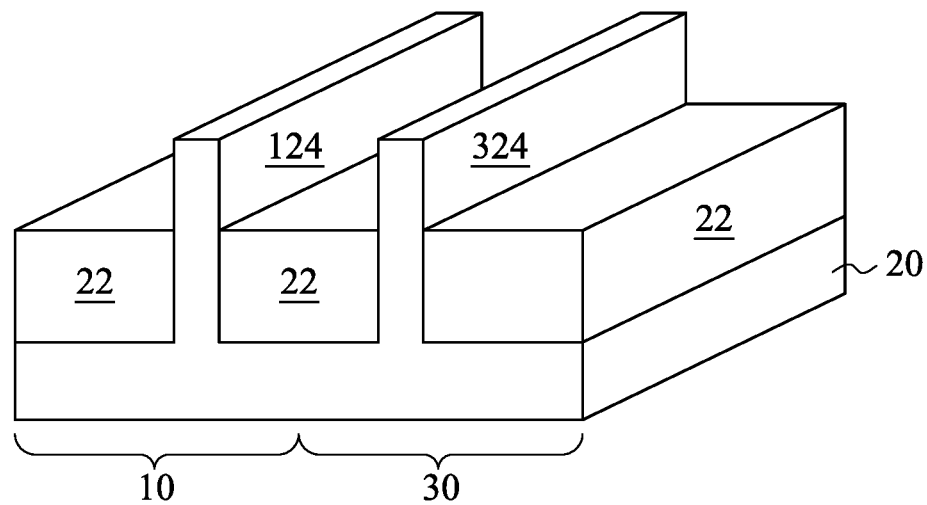
FIGS. 2-13 are perspective views and cross-sectional views illustrating intermediate stages in the fabricating of finFETs in accordance with some embodiments of the instant disclosure.

FIGS. 2 to 12 are perspective and cross-sectional views of a method for manufacturing a semiconductor device at various stages in accordance with some embodiments of the present disclosure. Referring to FIG. 2, a fin structure is formed. The FinFET includes a semiconductor substrate 20, which may be a silicon semiconductor substrate, a germanium semiconductor substrate, or a semiconductor substrate formed of other semiconductor materials. The semiconductor substrate 20 may be doped with a p-type or an n-type impurity. Isolation regions such as shallow trench isolation (STI) regions 22 may be formed in or over the semiconductor substrate 20. The fin structures 124 and 324 are formed above top surfaces of the STI regions 22. In some embodiments, the fin structures 124 and 324 are formed by recessing top portions of semiconductor substrate 20 between neighbouring the STI regions 22 to form recesses, and re-growing fin in the recesses. Top portions of the STI regions 22 may then be removed, while bottom portions of the STI regions 22 are not, so that the top portion of the re-grown fin between neighbouring the STI regions 22 becomes the fin structures 124 and 324. In some embodiments, the fin structures 124 and 324 are formed by patterning and etching the semiconductor substrate 20 to form recesses. Dielectric material then fills between the recesses to form the STI regions 22.

The fin structures 124 and 324 may have channel dopings. The fin structures 124 may be doped with an n-type impurity such as phosphorous, while the fin structure 324 may be doped with a p-type impurity such as boron. The semiconductor substrate 20 includes a portion in PMOS device region 10 and a portion in NMOS device region 30. The fin structures 124 and 324 are in the PMOS device region 10 and the NMOS device region 30 respectively.

Figure 3:
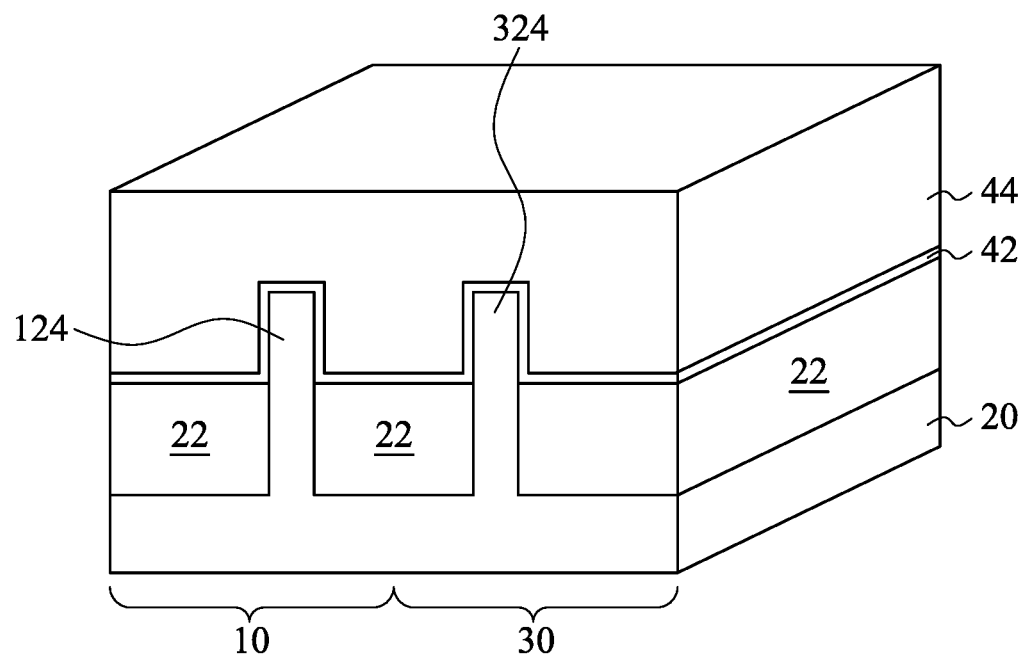

Referring to FIG. 3, gate dielectric layer 42 and gate electrode layer 44 are deposited in both PMOS device region 10 and NMOS device region 30 and over the fin structures 124 and 324. In some embodiments, the gate dielectric layer 42 is formed of a high-k dielectric material. The exemplary high-k materials may have k values larger than about 4.0, or even larger than about 7.0, and my include aluminium-containing dielectrics such as $Al_2O_3$, HfAlO, HfAlON, AlZrO, Hf-containing materials such as $HfO_2$, $HfSiO_x$, $HfAlO_x$, $HfZrSiO_x$, HfSiON, and/or other materials such as $LaAlO_3$ and $ZrO_2$. The gate electrode layer 44 is formed on the gate dielectric layer 42 and may include metal.

Figure 4:
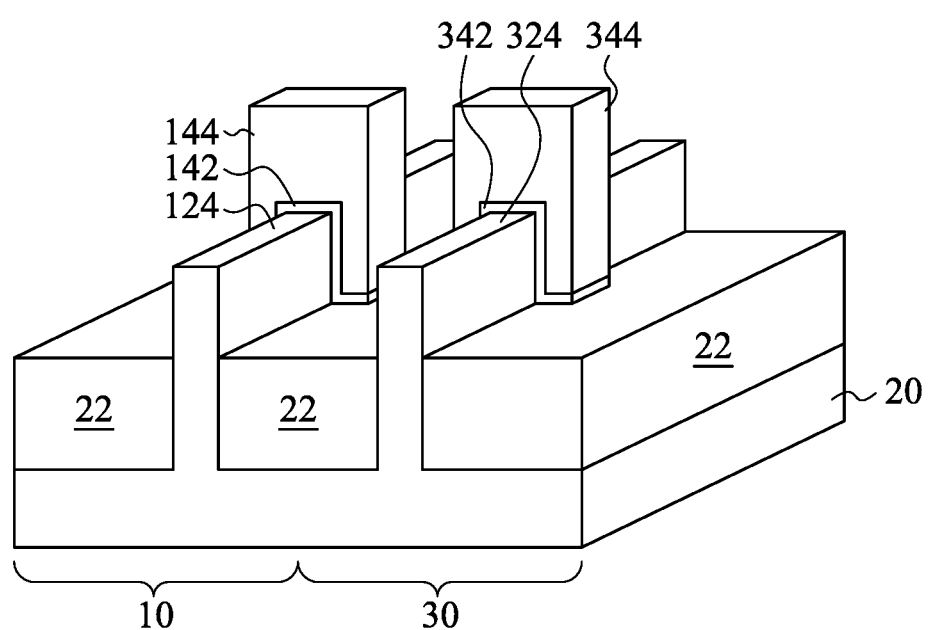

Referring to FIG. 4, the gate electrode layer 44 and gate dielectric layer 42 are patterned to form gate stacks. The gate stack in the PMOS device region 10 includes the gate electrode 144 and the gate dielectrics 142. The gate stack in the NMOS device region 30 includes the gate electrode 344 and the gate dielectric 342. Each of the fin structures 124 and 324 thus has portions that are uncovered by the gate stacks. In some embodiments, a gate-last process is employed. In this case, a dummy gate layer is used to replace the gate electrode layer. Dummy gate layer is later removed after gate spacers are formed, and gate electrode the fills in the space left by the dummy gate layer.

Figure 5:
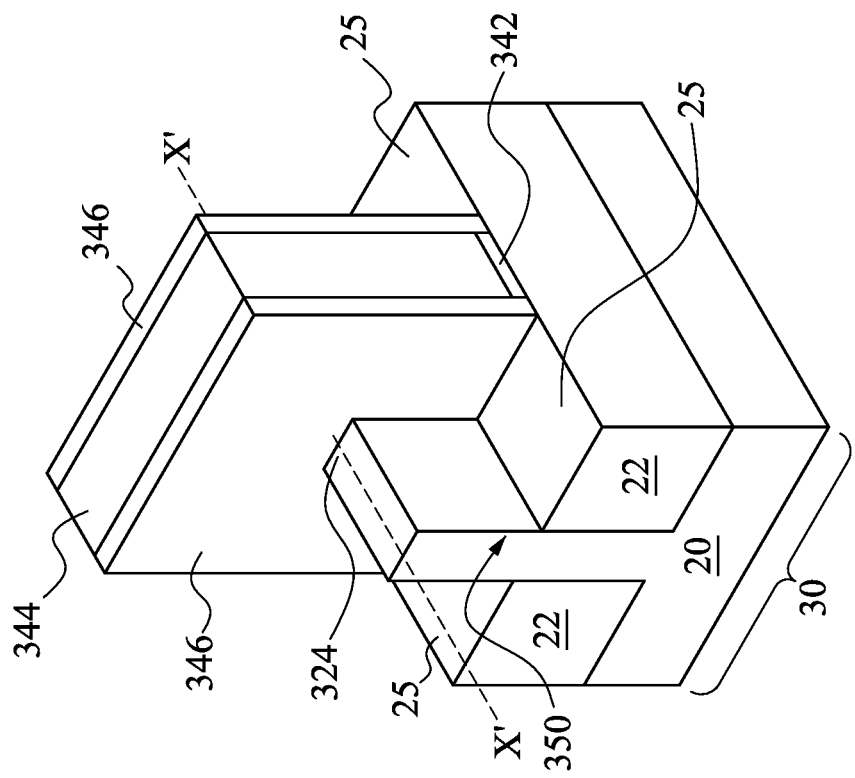
Figure 5:
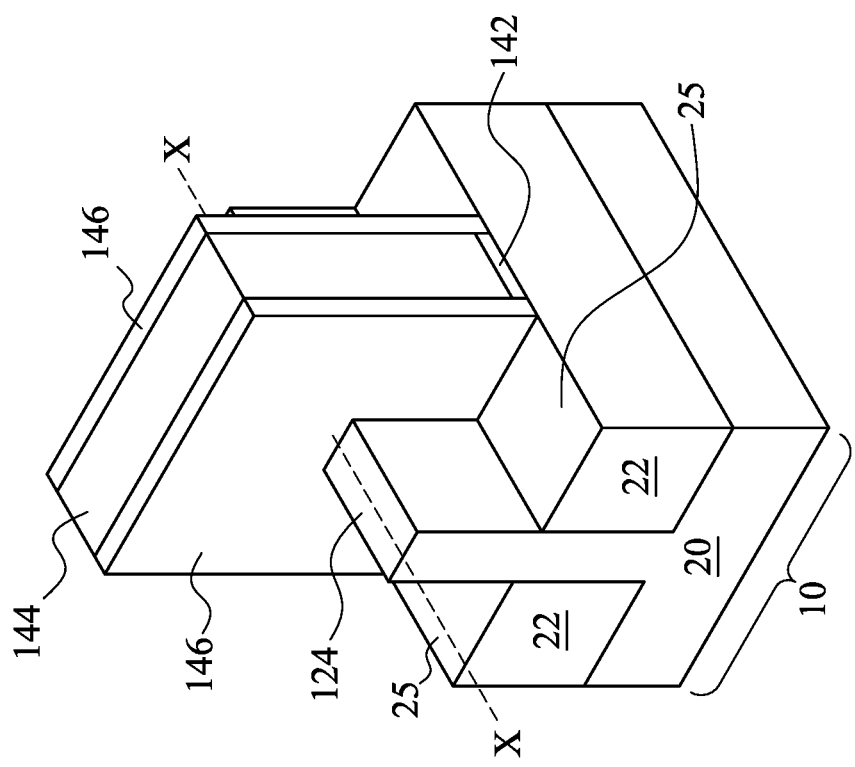

Referring to FIG. 5, gate spacers 146 and 346 are formed. PMOS device region 10 and NMOS device region 30 are shown separately for the sake of clarity. Spacer layer is deposited on the gate electrodes 144 and 344, uncovered fin structures 124 and 324, and over the STI regions 22. Spacer layer is then pattern to form gate spacers 146 and 346 around the gate stacks and leaving portions of fin structures 124 and 324 exposed again as shown in FIG. 5.

Figure 6:
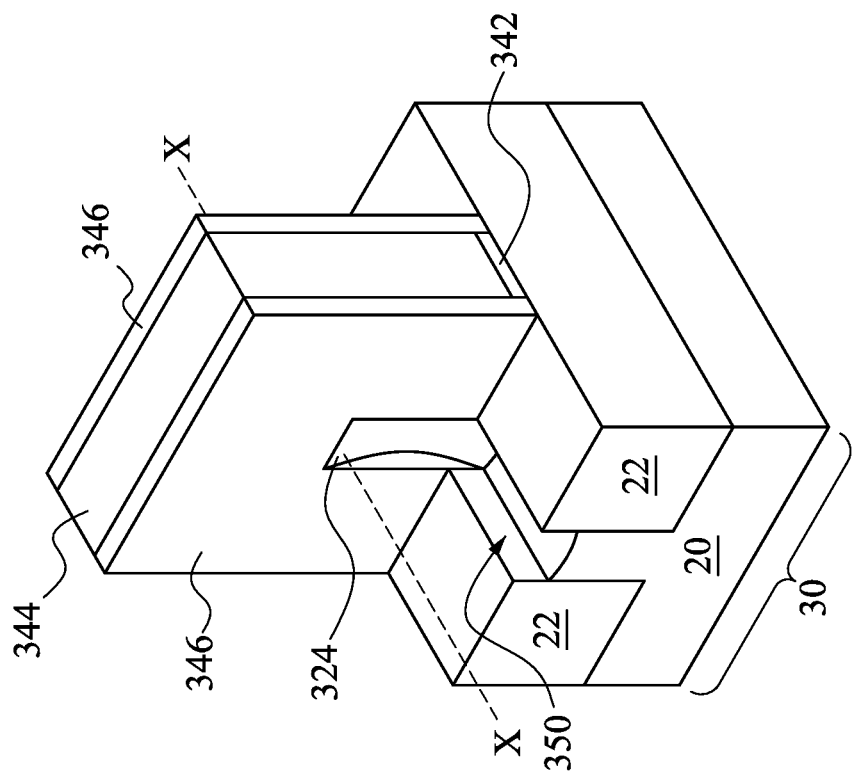
Figure 6:
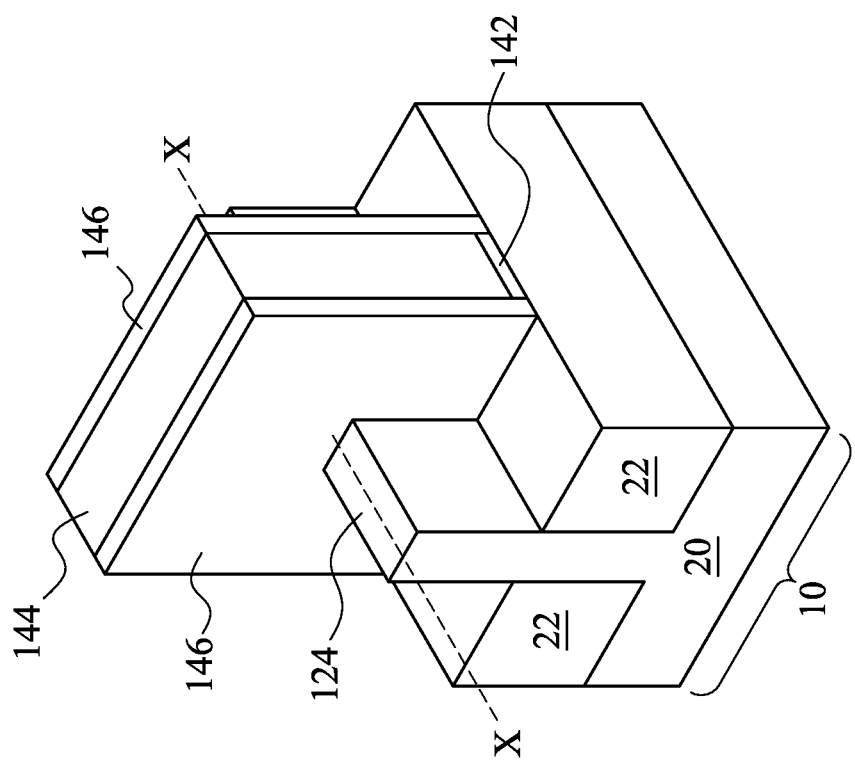

Referring to FIG. 6, first recesses 350 are formed. The exposed portions of the fin structure 324 are not covered by the gate dielectric 342, gate electrode 344 and gate spacers 346 in NMOS device region 30. The exposed portions of the fin structure 324 may be removed by, for example, a dry etch. The covered portions of the fin structure 324 are not removed. Slight consumption of covered portions of the fin structure 324 may occur during etching process as illustrated in FIG. 6. The spaces left by the removed portions of the fin structure 324 are referred to as first recesses 350. First recesses 350 may have bottoms level with top surfaces 25 of the STI regions 22. Alternatively, the bottoms of first recesses 350 may be lower than top surfaces 25 of the STI regions 22 as shown in FIG. 6. PMOS device region 10 is covered by a mask layer 52, for example, photo resist. The exposed portions of fin structure 124 are not removed and remain in PMOS device region 10 due to the protection of the mask layer 52.

Figure 7:
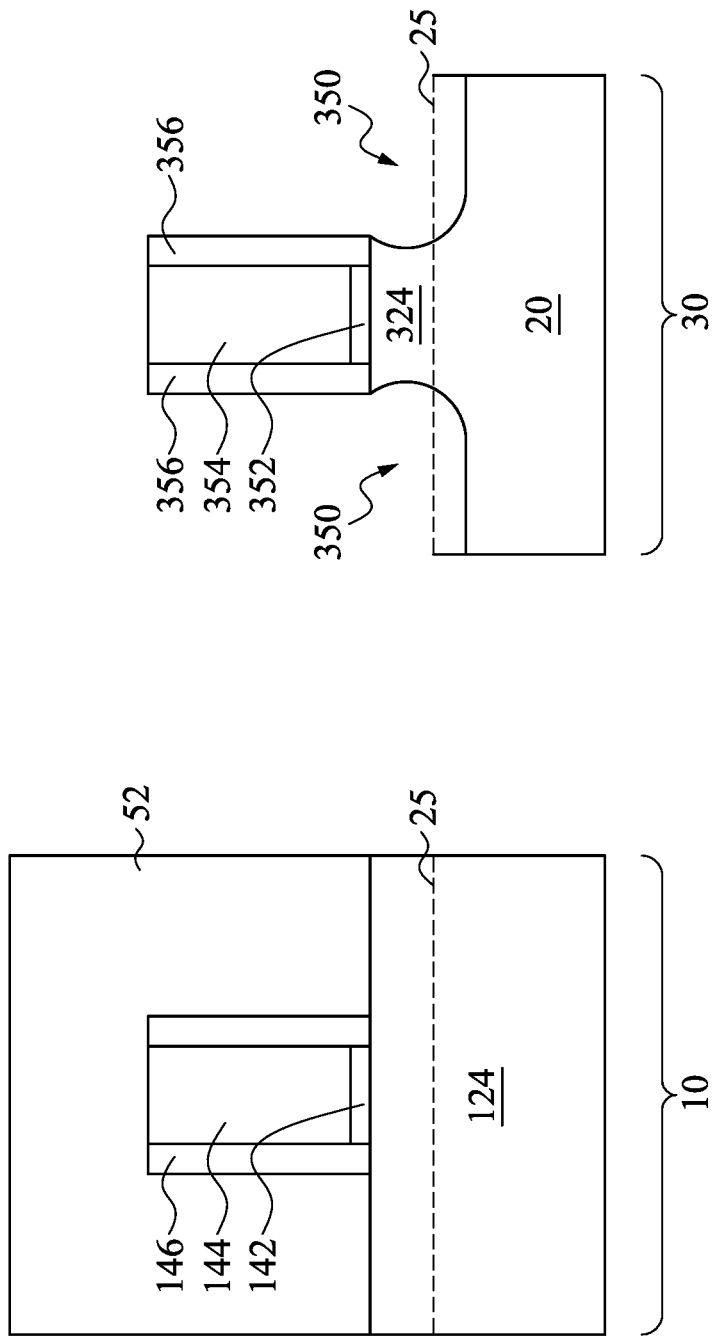

FIG. 7 illustrates a cross-sectional view of the structure shown in FIG. 6. The cross-sectional view of PMOS device region 10 is obtained in a vertical plane crossing line X-X in FIG. 6, while the cross-sectional view of NMOS device region 30 is obtained in a vertical plane crossing X-X in FIG. 6. Subsequent FIGS. 8 and 9 that illustrate the cross-sectional views of PMOS device region 10 and NMOS device region 30 are in a same plane.

Referring to FIG. 7, the first recesses 350 have bottoms lower than top surfaces 25 of the STI regions 22. The covered portions of the fin structure 324 is slightly consumed, while gate dielectric 352, gate electrode 354, and gate spacers 356 remain on the remaining the fin structure 324.

Figure 8:
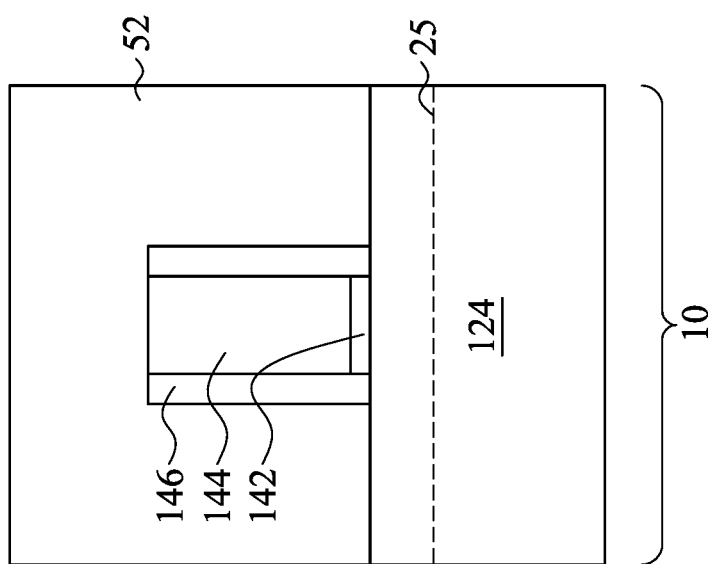

Next, as shown in FIG. 8, the PMOS device region 10 is covered, and first epitaxy structures 362 are epitaxially grown in the first recesses 350. The term "epitaxy", "epitaxial", and "epitaxially grown" hereinafter referred to the growth on a crystalline substrate of a crystalline substance that mimics the orientation of the substrate, but the final product may not be crystalline. The first epitaxy structures 362 have a lattice constant greater than the lattice constant of the fin structure 324. During the epitaxial process of forming the first epitaxy structures 362, p-type dopants (impurities) such as germanium and boron may be doped with the proceeding epitaxial processes. The dopant concentration in terms of surface distribution may be between about $5\%/cm^3$ and $10\%/cm^3$. In some embodiments, low temperature condition is applied during first epitaxy structures 362 formation. The temperature is lower than about 600° C. to allow the first epitaxy structures 362 to grow faster along <111> plane. Due to the selection of dopant, low temperature condition, and fine regulation of dopant concentration during epitaxy process, the first epitaxy structures 362 grow slower along <100> plane, and therefore elongated bar like first epitaxy structures 362 are formed. The first epitaxy structures 362 fill in the first recesses 350 and grow high in a direction that is away from the semiconductor substrate 20. In some embodiments, the first epitaxy structure 362 may have slanting sidewalls that taper gradually toward top surface. The first epitaxy structures 362 have a width measured between two the STI regions 22 and a height measured from bottoms of first recesses 350. The width is much smaller than the height to create slim bar like structures protruding over surfaces 25 of the STI regions 22.

Figure 9:
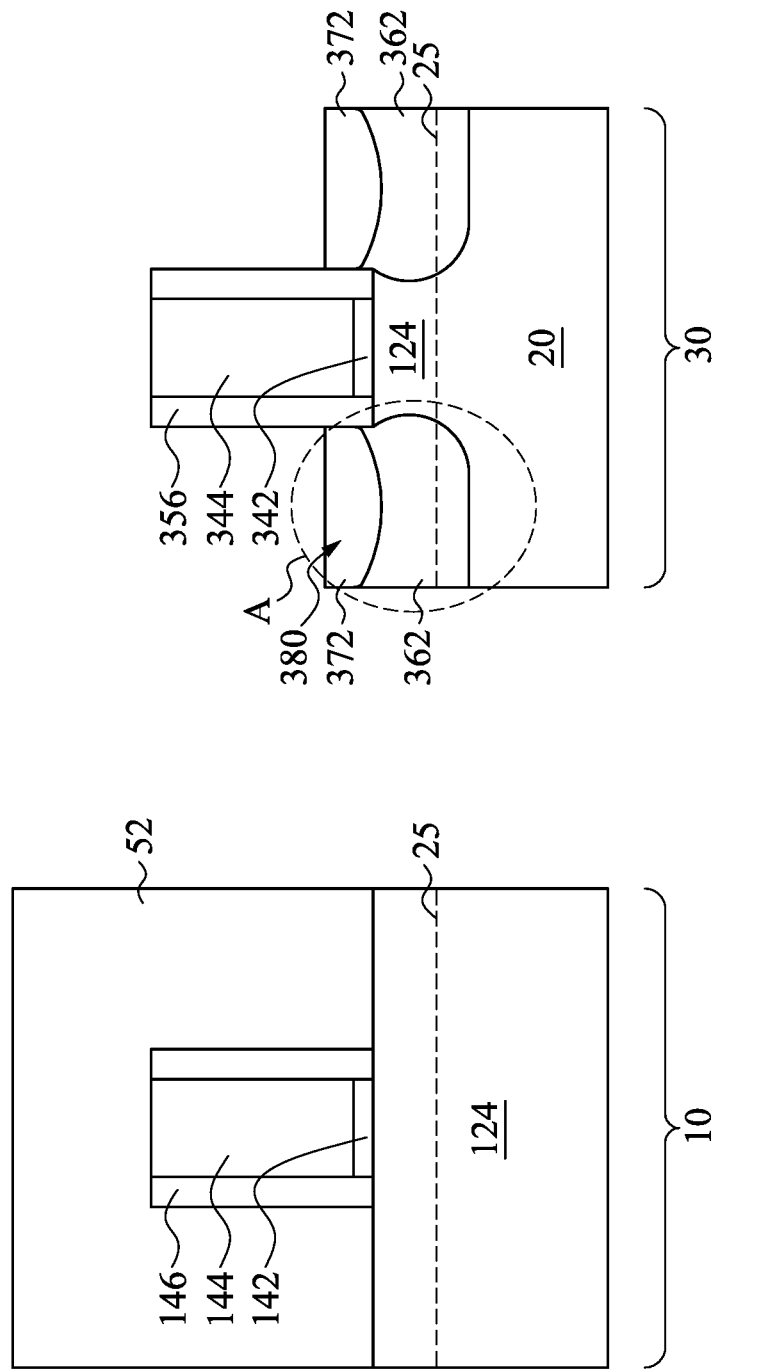

Referring to FIG. 9, epitaxy coats 372 are formed. Epitaxy coats 372 are epitaxially grown over the first epitaxy structures 362. Epitaxy coats 372 have a lattice constant smaller than the lattice constant of the fin structure 124. During the epitaxial process of forming the epitaxy coats 372, n-type dopants (impurities) such as phosphorous and/or arsenic may be in-situ doped when epitaxial growth proceeds. Sidewalls and top surfaces of the first epitaxy structures 362 are blanked by epitaxy coats 372. Epitaxy coats 372 conform to outline of first epitaxy structures 362, resembling horseshoes crossing over first epitaxy structures 362. Source and drain (referred to as source/drain hereinafter) regions 380 of NMOS device region 30 are then formed. Source/drain regions 380 are also alternatively referred to as source/drain stressors 380 and may have a lattice constant smaller than the lattice constant of the fin structure 124. With the lattice constant of the source/drain regions 380 being smaller than that of the fin structure 124, the source/drain regions 380 apply a tensile stress to the fin structure 124, which forms the channel region of the resulting n-type FinFET device.

Figure 15B:
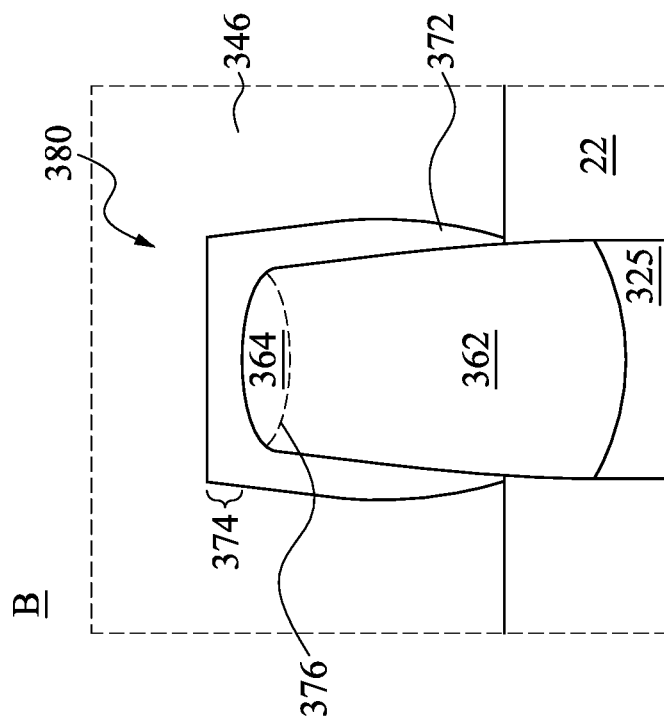
FIG. 15B is an enlarged view of a portion B of FIG. 14B.
Figure 15A:
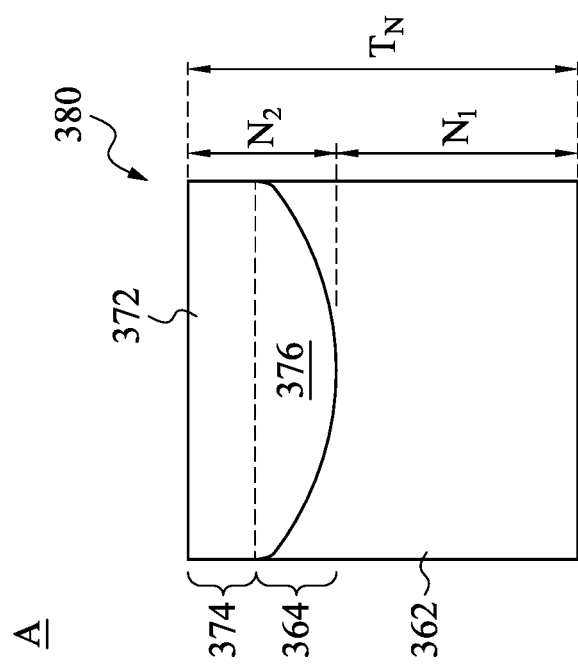
FIG. 15A is an enlarged view of a portion A of FIG. 9.

Referring to FIG. 15A, an enlarged view of portion A in FIG. 9 is illustrated. The source/drain region 380 includes the first epitaxy structure 362 and the epitaxy coat 372. The first epitaxy structure 362 has top portion 364 in which the epitaxy coat 372 permeates through to form a fringe portion 376 of the epitaxy coat 372. The epitaxy coat 372 piles up on a top portion 364 of the first epitaxy structure 362 and adds a thickness to the first epitaxy structure 362. This portion is referred to as a ridge portion 374. Thickness $T_N$ represents entire thickness of the source/drain region 380 measured from the bottom of the first recess 350. Thickness $T_N$ ranges between about 45 and 55 nm. $N_1$ and $N_2$ represent lower portion and upper portion of source/drain region 380 respectively. Lower portion $N_1$ is majorly constituted of the first epitaxy structure 362, and upper portion $N_2$ includes top portion 364 of the first epitaxy structure 362, fringe portion 376 and ridge portion 374 of the epitaxy coat 372. Lower portion $N_1$ has a thickness ranging between about 30-45 nm, and upper portion $N_2$ has a thickness greater than about 12 nm. In other words, the epitaxy coat 372 accounts for approximately one third (⅓) of thickness $T_N$ of source/drain region 380.

Still referring to FIG. 15A, lower portion $N_1$ has a first dopant concentration, in which the first dopant has lattice constant greater than the fin structure 324, between about 5%/cm$^3$ and 10%/cm$^3$. Lower portion $N_1$ also has a second dopant concentration, in which the second dopant has lattice constant smaller than the fin structure 324, of about $2\times10^{20}$/cm$^3$. Upper portion $N_2$ has the second dopant concentration between about $3\times10^{21}$/cm$^3$ and $4\times10^{21}$/cm$^3$. The source/drain region 380 exhibits second dopant concentration gradient that gradually reduces from the ridge portion 374 to fringe portion 376 and further down to lower portion $N_1$ of the first epitaxy structure. The ridge portion 374 has the highest second dopant concentration, while lower portion $N_1$ is milder because first dopant dilutes second dopant concentration. First dopant and second dopant concentration at lower portion $N_1$ is finely controlled at a predetermined level, or electrical leakage may occur.

Referring back to FIG. 9, the source/drain regions 380 are constituted of different types of dopants. In some embodiments, one of the dopant may be p-type stressor and the other n-type stressor. P-type stressor allows the first epitaxy structures 362 to grow in a specific orientation, resulting in slim, narrow, bar-like first epitaxy structures 362. Next, n-type stressor is used to form the epitaxy coat 372 and applies tensile stress to the fin structure 324. N-type stressor follows the bar-like first epitaxy structures 362 and is less likely to overstretch toward the STI regions 22. Source/drain regions 380 are not in a diamond shape and confined in the spaces left by the first recesses 350.

Figure 10:
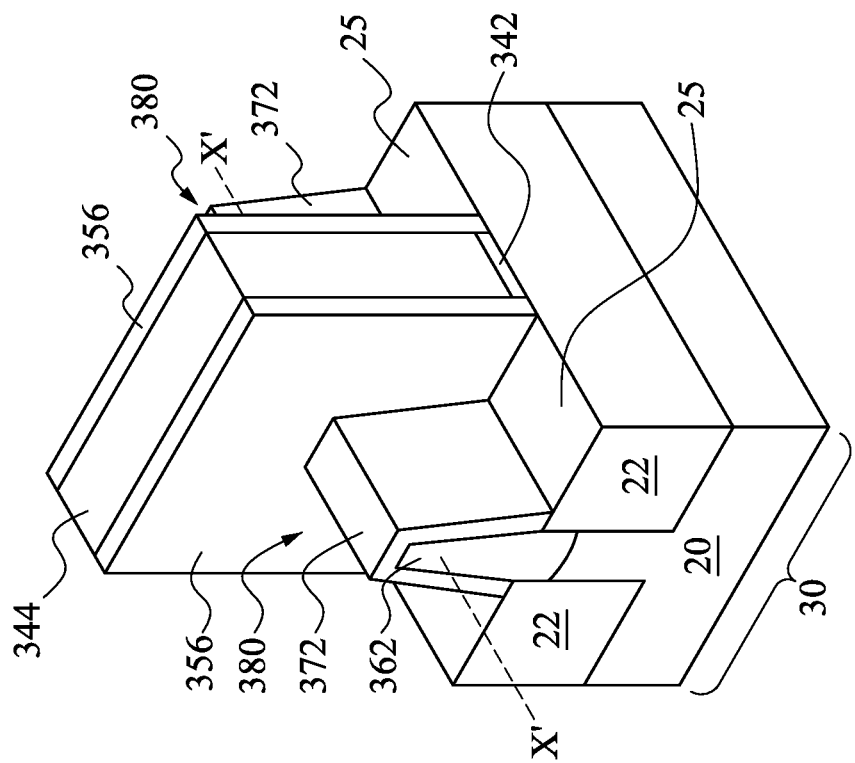
Figure 10:
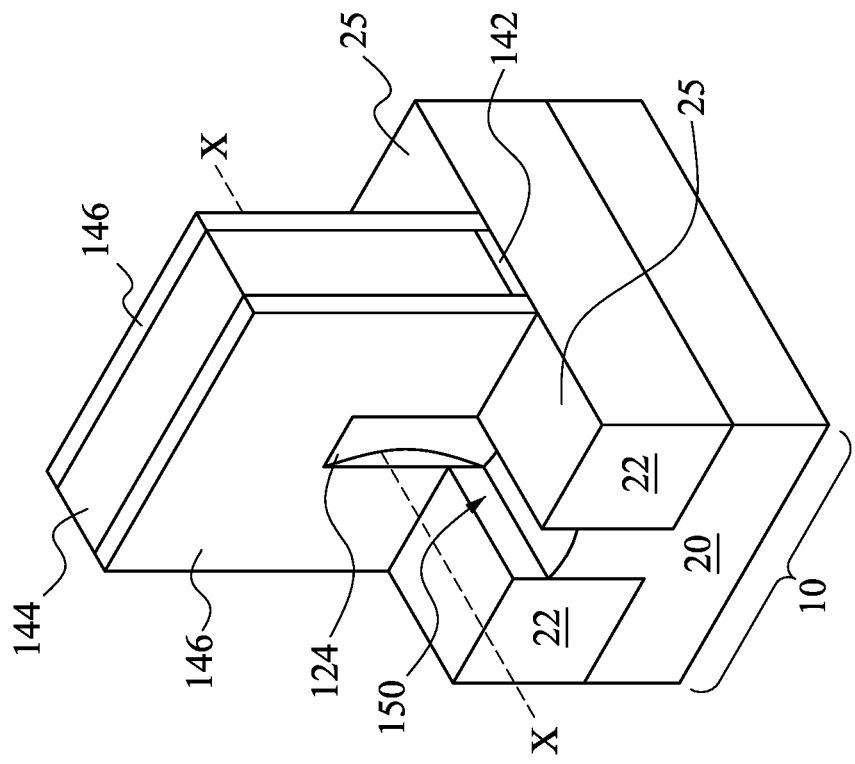

Referring to FIG. 10, second recesses 150 are formed. After the epitaxial growth of source/drain regions 380, the mask layer 52 is removed. The exposed portions of the fin structure 124 are not covered by gate dielectrics 142, gate electrode 144 and gate spacers 146 in the PMOS device region 10. The exposed portions of fin structure 124 may be removed by, for example, a dry etch. The covered portions of fin structure 124 are not removed. Slight consumption of covered portions of fin structure 124 may occur during etching process as illustrated in FIG. 10. The spaces left by the removed portions of fin structure 124 are referred to as second recesses 150. Second recesses 150 may have bottoms level with top surfaces 25 of the STI regions 22. Alternatively, the bottoms of second recesses 150 may be lower than top surfaces 25 of the STI regions 22 as shown in FIG. 10. NMOS device region 30 is covered by mask layer (not shown), for example, photo resist. The source/drain regions 380 are not removed and remain in PMOS device region 10 due to the protection of mask layer.

Due to shrinkage of cell dimension in ever compacting integrated circuit, densely arranged components imply limited spaces between each device. The slim, narrow, bar-like first epitaxy structures 362 ensures n-type stressor on NMOS device region 30 does not expand laterally to PMOS device region 10. The first epitaxy structures 362 are scaffoldings for the subsequently formed the epitaxy coat 372. The configuration of first epitaxy structures 362 prevents the epitaxy coat 372 from lateral development. When forming the second recesses 150 on PMOS device region 10, the source/drain regions 380 on NMOS device region 30 are less likely to be damaged, for example, by etching consumption.

Figure 11:
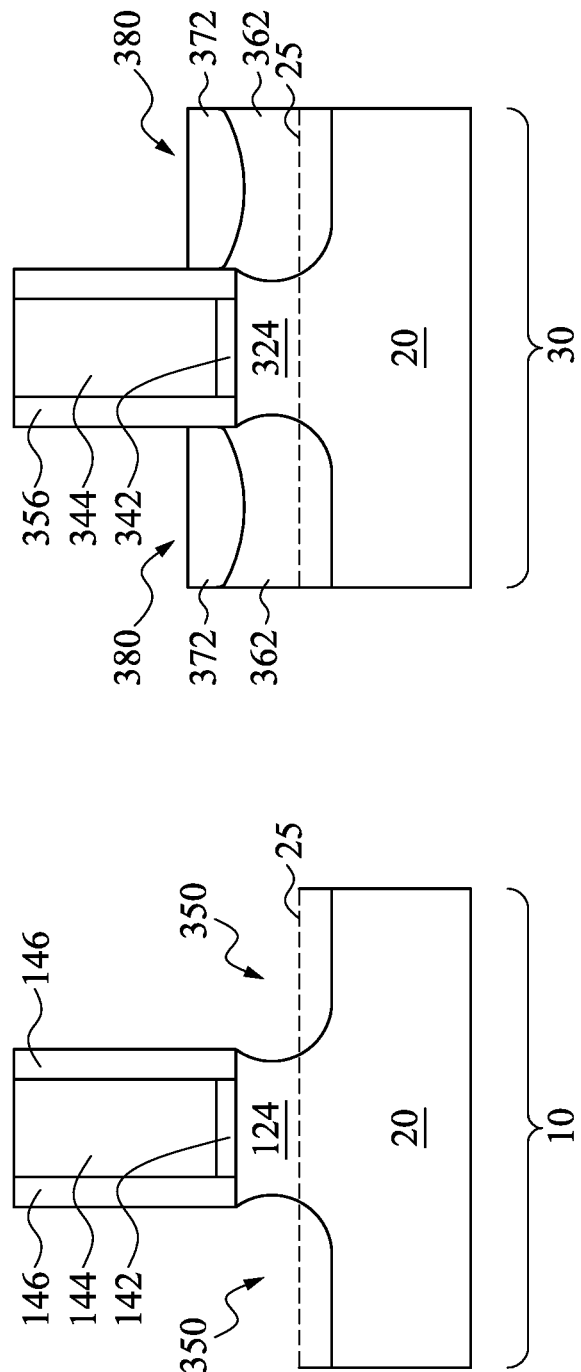

FIG. 11 illustrates a cross-sectional view of the structure shown in FIG. 10. The cross-sectional view of PMOS device region 10 is obtained in a vertical plane crossing line X-X in FIG. 10, while the cross-sectional view of NMOS device region 30 is obtained in a vertical plane crossing X-X in FIG. 6. Subsequent FIG. 12 that illustrates the cross-sectional views of PMOS device region 10 and NMOS device region 30 are in a same plane.

Referring to FIG. 11, the first recesses 350 have bottoms lower than top surfaces 25 of The STI regions 22. The covered portions of fin structure 124 is slightly consumed, while gate dielectric 152, gate electrode 154, and gate spacers 156 remain on the remaining fin structure 124.

Figure 12:
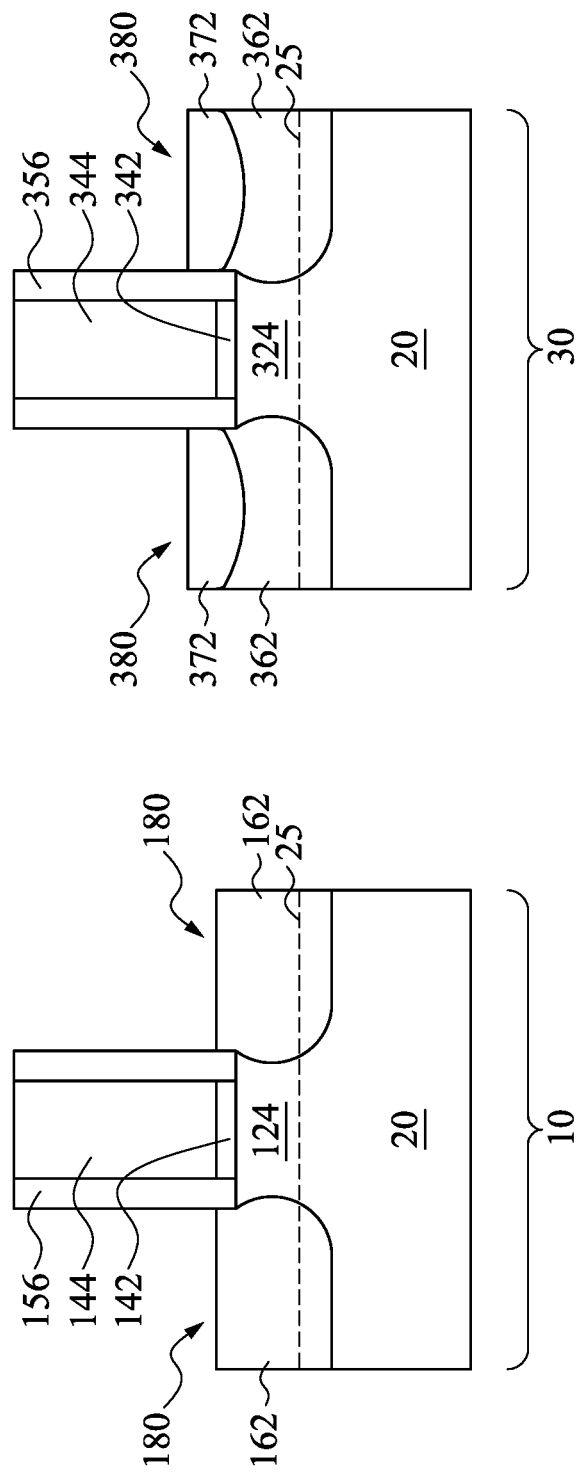

Next, as shown in FIG. 12, second epitaxy structures 162 are epitaxially grown in the second recesses 150. The second epitaxy structures 162 have a lattice constant greater than the lattice constant of fin structure 124. During the epitaxial process of forming the second epitaxy structures 162, p-type dopants (impurities) such as germanium and boron may be doped with the proceeding epitaxial processes. The dopant concentration in terms of surface distribution may be between about 5%/cm$^3$ and 10%/cm$^3$. In some embodiments, low temperature condition is applied during the second epitaxy structures 162 formation. The temperature is lower than about 600° C. to allow the second epitaxy structures 162 to grow faster along <111> plane. Due to the selection of dopant, low temperature condition, and fine regulation of dopant concentration during epitaxy process, the second epitaxy structures 162 grow slower along <100> plane, and therefore elongated bar like second epitaxy structures 162 are formed. The second epitaxy structures 162 fill in the second recesses 150 and grow high in a direction that is away from the semiconductor substrate 20. In some embodiments, the second epitaxy structure 162 may have slanting sidewalls that taper gradually toward top surface. The second epitaxy structures 162 have a width measured between two the STI regions 22 and a height measured from bottoms of second recesses 150. The width is much smaller than the height to create slim bar like structures protruding over surfaces 25 of the STI regions 22. Source/drain regions 180 of PMOS device region 10 are then formed. Source/drain regions 180 are also alternatively referred to as source/drain regions 180 and may have a lattice constant greater than the lattice constant of fin structure 124. With the lattice constant of source/drain regions 180 being greater than that of fin structure 124, source/drain regions 180 apply a compressive stress to fin structure 124, which forms the channel region of the resulting p-type FinFET device.

Figure 13:
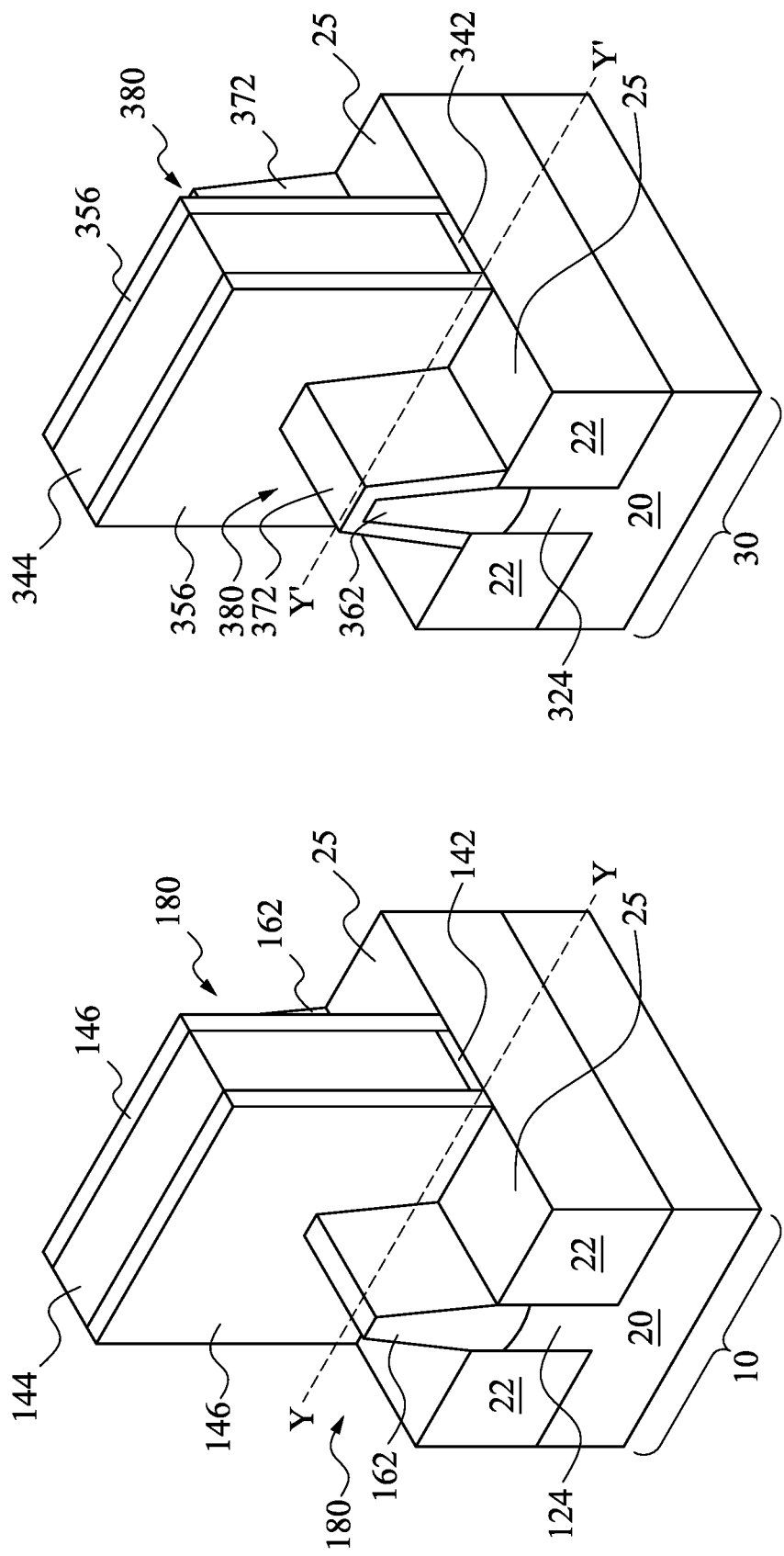

Referring to FIG. 13, the first epitaxy structures 362 and second epitaxy structures 162 may be made of same material that has lattice constant greater than fin structures 124 and 324. The first epitaxy structures 362 and second epitaxy structures 162 have the characteristics of fast growing along <111> crystal orientation. Under low temperature condition (e.g., lower than 600° C.), the phenomenon is even more pronounced. Aspect ratio of the first epitaxy structures 362 and the second epitaxy structures 162 may be controlled in the proceeding of epitaxy growth by tuning dopant concentration and ratio of different dopants. For example, when germanium and boron are used as p-type stressor, the ratio between germanium and boron (Ge:B) may be adjusted so as to obtain desirable configuration of the first epitaxy structures 362 and second epitaxy structures 162. As a result, the first epitaxy structure 362 and second epitaxy structure 162 are amorphous and have elongated bar-like shape when the first recesses 350 and second recesses 150 are filled in.

Figure 14B:
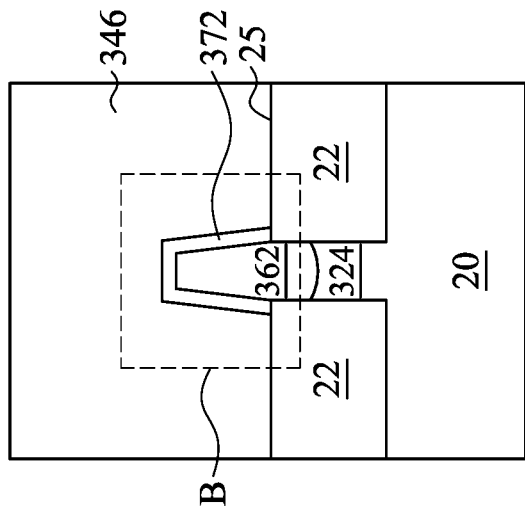
FIG. 14B is a cross-sectional view along Y'-Y' of finFET 30 in FIG. 13.
Figure 14A:
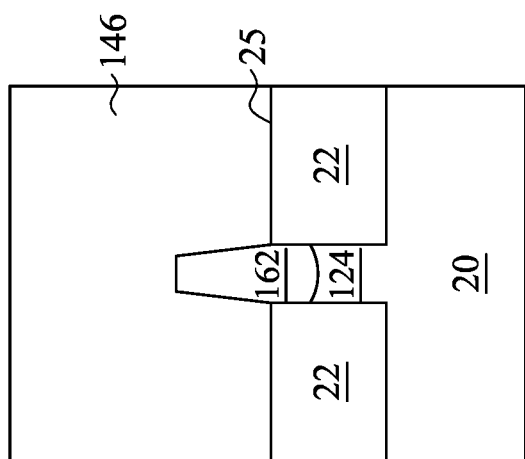
FIG. 14A is a cross-sectional view along Y-Y of finFET 10 in FIG. 13.

FIGS. 14A and 14B illustrate cross-sectional views of the structure shown in FIG. 13. The cross-sectional view of PMOS device region 10 is obtained in a vertical plane crossing line Y-Y in FIG. 13, while the cross-sectional view of NMOS device region 30 is obtained in a vertical plane crossing Y'-Y' in FIG. 13.

Referring to FIGS. 14A and 14B, cross-sectional views of the first epitaxy structures 326 and the second epitaxy structures 126 are close to rectangle with narrow width and stretching height. The first epitaxy structures 362 and second epitaxy structures protrude over top surfaces 25 of the STI regions 22. Even with densely packed layout design, the patterning processes of PMOS device region 10 and NMOS device region 30 do not damage its neighbouring components. The second epitaxy structures 162 is on the PMOS device region 10 and not covered by the epitaxy coat 372, while the first epitaxy structure 362 is on the NMOS device region 30 and covered by the epitaxy coat 372.

FIG. 15B illustrates an enlarged view of portion B in FIG. 14B. Referring to FIG. 15B, the source/drain region 380 includes the first epitaxy structure 362 contains p-type stressor that allows the first epitaxy structure 362 to grow into elongated bar-like shape. The first epitaxy structure 362 is used as the skeleton for the epitaxy coat 372. The epitaxy coat 372 contains n-type stressor that has lattice constant smaller than channel region 325. The epitaxy coat 372 grows conformally along contour of the first epitaxy structure 362 and therefore resembles a horseshoe clutching across the first epitaxy structure 362. The epitaxy coat 372 has a ridge portion 374 sitting on top of the first epitaxy structure 362. Due to epitaxial growing process, the epitaxy coat 372 permeates through into the top portion 364 of the first epitaxy structure 362. The fringe portion 376 refers to a buffer area where concentrations of p-type and n-type stressor vary gradually. More specifically, source/drain region 380 exhibits a concentration gradient. In terms of n-type stressor, the concentration gradient gradually reduces from the ridge portion 374 to the first epitaxy structure 362. The fringe portion 364 has an n-type stressor concentration lower than that of the ridge portion 374 while slightly higher than that of the first epitaxy structure 362.

Source/drain region 380 is on NMOS device region 30, and a material having lattice constant larger than the channel region 325 is used for scaffolding, and then the epitaxy coat 372 that contains a material having lattice constant smaller than the channel region 325 is used. The epitaxy coat 372 applies tensile stress to the channel region 325. It is not uncommon of an n-type source/drain region having excess dimension especially in terms of lateral development. When n-type stressor is epitaxially grown on an existing structure (i.e., first epitaxy structure), excess lateral development is minimized because epitaxy coat follows contour of first epitaxy structure. As shown in FIG. 15B, the epitaxy coat 372 wraps around the first epitaxy structure 362 in a thin layer and permeates slightly into the first epitaxy structure 362. Source/drain region 380 functions as n-type source/drain stressor and has p-type skeleton.

In an NMOS device region, using a first epitaxy structure having lattice constant larger than the channel region as scaffolding for the source/drain regions, and epitaxy coat blankets the first epitaxy structure to apply tensile stress to the channel region. Configuration of the source/drain regions is well controlled as elongated bar like structure to prevent excess lateral source/drain region development.

According to some embodiments of the disclosure, a method includes forming a fin in a substrate; etching the fin to create a source/drain recess; forming a source/drain feature in the source/drain recess, wherein a lattice constant of the source/drain feature is greater than a lattice constant of the fin; and growing an epitaxy coat over the source/drain feature, wherein a lattice constant of the epitaxy coat is smaller than a lattice constant of the fin. In some embodiments, the method further includes forming an isolation structure surrounding a lower portion of the fin, wherein etching the fin is performed such that a bottom surface of the source/drain recess is lower than a top surface of the isolation structure. In some embodiments, forming the source/drain feature is performed such that the source/drain feature comprises an elongated portion protruding from the top surface of the isolation structure. In some embodiments, growing the epitaxy coat is performed such that the epitaxy coat covers a top surface and sidewalls of the elongated portion of the source/drain feature. In some embodiments, forming the source/drain feature is performed such that the elongated portion of the source/drain feature tapers upwards. In some embodiments, growing the epitaxy coat is performed such that the epitaxy coat is in contact with the isolation structure. In some embodiments, forming the source/drain feature is performed using a temperature lower than about 600° C. In some embodiments, forming the fin is performed such that the fin is doped with an n-type impurity. In some embodiments, the source/drain feature comprises phosphorus.

According to some embodiments of the disclosure, a method includes forming a fin in a substrate; etching the fin to create a source/drain recess; forming a source/drain feature in the source/drain recess, wherein the source/drain feature comprises germanium; and growing an epitaxy coat over the source/drain feature, wherein the epitaxy coat comprises phosphorus. In some embodiments, an upper portion of the source/drain feature comprises phosphorus. In some embodiments, a first phosphorus concentration in the upper portion of the source/drain feature is higher than a second phosphorus concentration in a lower portion of the source/drain feature. In some embodiments, a first phosphorus concentration in the upper portion of the source/drain feature is lower than a second phosphorus concentration in the epitaxy coat. In some embodiments, the epitaxy coat is spaced apart from the fin. In some embodiments, forming the source/drain feature is performed such that the source/drain feature has opposite first and second sidewalls inclined toward each other and a top surface extending laterally from a top end of the first sidewall of the source/drain feature to a top end of the second sidewall of the source/drain feature.

According to some embodiments of the disclosure, a method includes forming a fin in a substrate, wherein the fin is doped with an n-type impurity; etching the fin to create a source/drain recess; forming a source/drain feature in the source/drain recess, wherein the source/drain feature comprises germanium; and growing an epitaxy coat over the source/drain feature, wherein a lattice constant of the epitaxy coat is smaller than a lattice constant of the source/drain feature. In some embodiments, forming the source/drain feature and growing the epitaxy coat is performed such that the source/drain feature has a concave top surface in contact with the epitaxy coat. In some embodiments, growing the epitaxy coat is performed such that the epitaxy coat has a flat top surface. In some embodiments, growing the epitaxy coat is performed such that the epitaxy coat has a phosphorus concentration reducing gradually from the flat top surface. In some embodiments, growing the epitaxy coat is performed such that the epitaxy coat has a thicker portion over the concave top surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor substrate;
   a silicon fin structure protruding over the semiconductor substrate;
   an isolation structure alongside a bottom portion of the silicon fin structure;
   a gate stack crossing the silicon fin structure; and
   a source/drain region over the silicon fin structure, wherein the source/drain region comprising a silicon germanium epitaxy structure and a silicon phosphorus epitaxy coat over the silicon germanium epitaxy structure, wherein the silicon phosphorus epitaxy coat crosses the silicon germanium epitaxy structure and in contact with a top surface of the isolation structure.

2. The semiconductor device of claim 1, wherein a lattice constant of the silicon phosphorus epitaxy coat is smaller than a lattice constant of the silicon fin structure.

3. The semiconductor device of claim 2, wherein a lattice constant of the silicon germanium epitaxy structure is greater than the lattice constant of the silicon fin structure.

4. The semiconductor device of claim 1, wherein the silicon phosphorus epitaxy coat extends along a top surface and sidewalls of an upper portion of the silicon germanium epitaxy structure.

5. The semiconductor device of claim 1, wherein the silicon germanium epitaxy structure has a bar-like cross-section.

6. A semiconductor device comprising:
   a semiconductor substrate;
   an N-type transistor over the semiconductor substrate, comprising:
      a first fin structure;
      an isolation structure alongside a bottom portion of the first fin structure; a first gate stack over the first fin structure; and
      a first source/drain region over the first fin structure, wherein the first source/drain region comprises a first epitaxy structure and an epitaxy coat over the first epitaxy structure, and a lattice constant of the epitaxy coat is smaller than a lattice constant of the first fin structure, wherein the epitaxy coat crosses the first epitaxy structure and is in contact with a top surface of the isolation structure, and wherein the epitaxy coat is made of silicon phosphorus and the first epitaxy structure is made of silicon germanium; and
   a P-type transistor over the semiconductor substrate, comprising:
      a second fin structure;
      a second gate stack over the second fin structure; and
      a second source/drain region over the second fin structure, wherein the second source/drain region comprises a second epitaxy structure, and wherein a surface of the second epitaxy structure is free of coverage by a material of the epitaxy coat of the first source/drain region.

7. The semiconductor device of claim 6, wherein the first epitaxy structure and the second epitaxy structure both include a bar-like cross-section.

8. The semiconductor device of claim 6, wherein a lattice constant of the first epitaxy structure is greater than the lattice constant of the first fin structure, and a lattice constant of the second epitaxy structure is greater than a lattice constant of the second fin structure.

9. The semiconductor device of claim 6, wherein the epitaxy coat extends along a top surface and sidewalls of an upper portion of the first epitaxy structure.

10. The semiconductor device of claim 6, wherein a top portion of the first fin structure protrudes from the top surface of the isolation structure.

11. The semiconductor device of claim 6, wherein the first fin structure is made of silicon.

12. The semiconductor device of claim 6, wherein the second epitaxy structure comprise silicon germanium.

13. A semiconductor device comprising:
    a semiconductor substrate;
    a fin structure protruding over the semiconductor substrate;
    an isolation structure alongside a bottom portion of the fin structure;
    a gate stack crossing the fin structure;
    gate spacers on opposite sidewalls of the gate stack; and
    a source/drain region over the fin structure, wherein the source/drain region comprising an epitaxy structure and an epitaxy coat lining sidewalls and a top surface of the epitaxy structure, wherein the epitaxy coat is in contact with a top surface of the isolation structure, and wherein the epitaxy coat is made of silicon phosphorus and the epitaxy structure is made of silicon germanium.

14. The semiconductor device of claim 13, wherein the fin structure is made of silicon.

15. The semiconductor device of claim 13, wherein a lattice constant of the epitaxy coat is smaller than a lattice constant of the fin structure.

16. The semiconductor device of claim 13, wherein a top portion of the fin structure protrudes from the top surface of the isolation structure.

17. The semiconductor device of claim 13, wherein the epitaxy structure has a bar-like cross-section.

18. The semiconductor device of claim 13, wherein the epitaxy coat is separated from the fin structure through the epitaxy structure.

19. The semiconductor device of claim 13, wherein a dopant concentration of the epitaxy coat gradually decreases from a first portion of the epitaxy coat to a second portion of the epitaxy coat below the first portion of the epitaxy coat.

20. The semiconductor device of claim 13, wherein the epitaxy coat has a dopant concentration between about $3 \times 10^{21}/cm^3$ and $4 \times 10^{21}/cm^3$.

* * * * *